(12) United States Patent
Lee et al.

(10) Patent No.: US 9,362,447 B2
(45) Date of Patent: Jun. 7, 2016

(54) SEMICONDUCTOR LIGHT EMITTING DEVICE

(71) Applicant: SAMSUNG ELECTRONICS CO., LTD., Suwon-Si, Gyeonggi-do (KR)

(72) Inventors: Jong Hyun Lee, Seoul (KR); Sang Heon Han, Suwon-si (KR); Suk Ho Yoon, Seoul (KR); Jae Sung Hyun, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/508,784

(22) Filed: Oct. 7, 2014

(65) Prior Publication Data

US 2015/0200332 A1    Jul. 16, 2015

(30) Foreign Application Priority Data

Jan. 15, 2014    (KR) ........................ 10-2014-0005291

(51) Int. Cl.
| | | |
|---|---|---|
| *H01L 33/00* | (2010.01) | |
| *H01L 29/15* | (2006.01) | |
| *H01S 5/20* | (2006.01) | |
| *H01S 5/34* | (2006.01) | |
| *H01L 33/04* | (2010.01) | |
| *H01L 33/14* | (2010.01) | |
| *H01L 33/02* | (2010.01) | |
| *H01L 33/06* | (2010.01) | |

(52) U.S. Cl.
CPC ............... *H01L 33/04* (2013.01); *H01L 29/15* (2013.01); *H01L 33/02* (2013.01); *H01L 33/025* (2013.01); *H01L 33/06* (2013.01); *H01L 33/14* (2013.01); *H01S 5/20* (2013.01); *H01S 5/34* (2013.01)

(58) Field of Classification Search
CPC ........................................................ H01L 33/26
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,145,184 B2 | 12/2006 | Fukuda et al. |

(Continued)

FOREIGN PATENT DOCUMENTS

| | | |
|---|---|---|
| KR | 10-0608919 B1 | 7/2006 |
| KR | 10-2009-0104454 A | 10/2009 |

(Continued)

*Primary Examiner* — Su C Kim
*Assistant Examiner* — David S Wilbert
(74) *Attorney, Agent, or Firm* — McDermott Will & Emery LLP

(57) ABSTRACT

There is provided a semiconductor light emitting device. The device includes an n-type semiconductor layer, and a p-type semiconductor layer. The p-type semiconductor layer includes a plurality of first layers and second layers, each containing a p-type impurity and are alternately stacked. The impurity concentrations of the plurality of first layers increase in a direction away from the n-type semiconductor layer. An active layer is disposed between the n-type semiconductor layer and the p-type semiconductor layer.

15 Claims, 8 Drawing Sheets

(56) References Cited

U.S. PATENT DOCUMENTS

| | | |
|---|---|---|
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,576,363 B2 | 8/2009 | Uemura et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,278,646 B2 | 10/2012 | Lee |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2007/0063207 A1* | 3/2007 | Tanizawa et al. ............. 257/94 |
| 2008/0025360 A1* | 1/2008 | Eichler et al. ............ 372/45.012 |
| 2008/0128727 A1* | 6/2008 | Erchak et al. .................. 257/98 |
| 2010/0148150 A1 | 6/2010 | Miki |
| 2011/0198633 A1 | 8/2011 | Tachibana et al. |
| 2012/0132943 A1 | 5/2012 | Hikosaka et al. |
| 2012/0138889 A1 | 6/2012 | Tachibana et al. |
| 2012/0286237 A1 | 11/2012 | Nago et al. |
| 2013/0039090 A1* | 2/2013 | Dau et al. ..................... 362/551 |
| 2013/0134475 A1 | 5/2013 | Han et al. |

FOREIGN PATENT DOCUMENTS

| | | |
|---|---|---|
| KR | 10-2010-0109629 A | 10/2010 |
| KR | 10-2013-0058406 A | 6/2013 |

* cited by examiner

SEMICONDUCTOR LIGHT EMITTING DEVICE

CROSS-REFERENCE TO RELATED APPLICATION

This application claims the benefit of Korean Patent Application No. 10-2014-0005291 filed on Jan. 15, 2014, with the Korean Intellectual Property Office, the disclosure of which is incorporated herein by reference.

TECHNICAL BACKGROUND

The present disclosure relates to a semiconductor light emitting device.

BACKGROUND

In general, a nitride semiconductor material has been widely used in green and blue light emitting diodes (LEDs) as well as in laser diodes provided as light sources in full-color displays, image scanners, various signaling systems, or in optical communications devices. Nitride semiconductor light emitting devices may be provided as light emitting devices having an active layer emitting light of various colors, including blue and green, through the recombination of electrons and holes.

The utilization of nitride light emitting devices has been expanded into new areas, such that nitride semiconductor light emitting devices have been actively studied for the purposes of general illumination devices, as well as for light sources in electronic devices. Recently, light sources in high current and high output fields have been proposed. Thus, research into improving the luminous efficiency and quality of semiconductor light emitting devices has been actively conducted and, in particular, of semiconductor layer structures aimed at improving the quantum efficiency of light emitting devices have been proposed.

SUMMARY

An aspect of the present disclosure provides a semiconductor light emitting device having enhanced electron-hole combination efficiency and increased active layer luminance by improving hole injection efficiency by increasing a p-type impurity concentration in a p-type semiconductor layer without degrading thin film crystallinity.

According to an aspect of the present disclosure, a semiconductor light emitting device includes an n-type semiconductor layer and a p-type semiconductor layer. The p-type semiconductor layer includes a plurality of first and second layers, each containing a p-type impurity, and are alternately stacked. Impurity concentrations of the plurality of first layers increase in a direction away from the n-type semiconductor layer. An active layer is disposed between the n-type semiconductor layer and the p-type semiconductor layer.

Each of the plurality of second layers may have an impurity concentration lower than that of the first layers immediately adjacent thereto.

Thicknesses of each of the plurality of second layers may be gradually decreased in a direction away from the active layer. A maximum difference in thickness of the plurality of second layers may be greater than a maximum difference in thickness of the plurality of first layers.

Thicknesses of each of the plurality of first layers may be gradually increased in a direction away from the active layer.

Thicknesses of each of the plurality of second layers may be gradually increased in a direction away from the active layer.

Thicknesses of each of the plurality of first layers may be equal to or greater than those of the second layers adjacent thereto.

The semiconductor light emitting device may further include a p-type contact layer disposed on the p-type semiconductor layer, wherein the p-type contact layer is disposed to be in contact with any one of the plurality of second layers.

The active layer may be disposed to be in contact with any one of the plurality of first layers included in the p-type semiconductor layer.

An n-type impurity may be doped in at least one of a plurality of interfaces between the plurality of first layers and the plurality of second layers.

Each of the plurality of second layers may be doped with a p-type impurity diffused from the first layers adjacent thereto.

The p-type semiconductor layer may include a third layer disposed at an interface between the p-type semiconductor layer and the active layer.

A thickness of the third layer may be determined according to a thickness of the p-type semiconductor layer.

According to another aspect of the present disclosure, a semiconductor light emitting device includes an n-type semiconductor layer; an active layer disposed on the n-type semiconductor layer; and a p-type semiconductor layer disposed on the active layer. The p-type semiconductor layer includes a plurality of first layers and second layers which are alternately stacked. The plurality of first layers and the plurality of second layers include a p-type impurity, and an impurity concentration of each of the plurality of second layers is lower than those of the first layers.

An impurity concentration of each of the plurality of first layers may be higher than or equal to that of other first layers disposed to be closer to the active layer.

Thicknesses of each of the plurality of first layers may be determined to correspond to an impurity concentration of each of the plurality of first layers.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
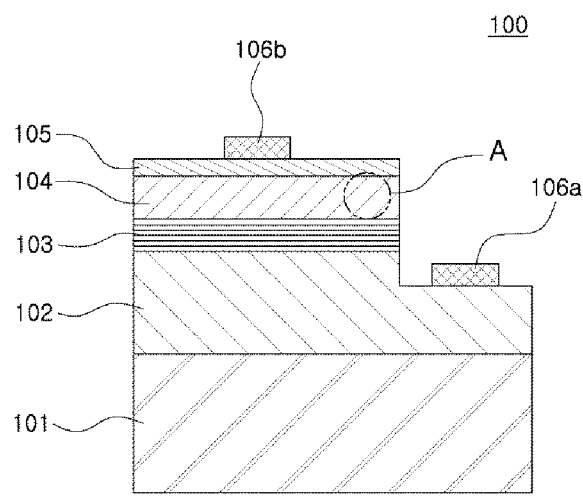
FIG. 1 is a cross-sectional view schematically illustrating a semiconductor light emitting device according to an exemplary embodiment of the present disclosure.

Hereinafter, exemplary embodiments of the present disclosure will be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

FIG. 1 is a cross-sectional view schematically illustrating a semiconductor light emitting device according to an exemplary embodiment of the present disclosure.

Figure 2:
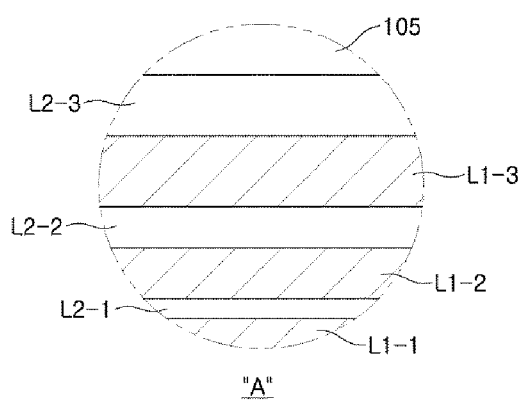
FIG. 2 is an enlarged view of a p-type semiconductor layer employable in the semiconductor light emitting device of FIG. 1.

FIG. 2 is an enlarged view of a p-type semiconductor layer employable in the semiconductor light emitting device of FIG. 1. Specifically, FIG. 2 is an enlarged view of region 'A' of FIG. 1.

Referring to FIG. 1, the semiconductor light emitting device 100 according to the present exemplary embodiment includes a substrate 101, an n-type semiconductor layer 102, an active layer 103, a p-type semiconductor layer 104, and a p-type contact layer 105. First and second electrodes 106a and 106b may respectively be formed on upper surfaces of the n-type semiconductor layer 102 and the p-type contact layer 105. However, in the present disclosure, terms such as 'upper portion', 'upper surface', 'lower portion', 'lower surface', 'lateral surface', and the like, are determined based on the drawings, and in actuality, the terms may be changed according to a direction in which a device is disposed.

The substrate 101 may be provided as a semiconductor growth substrate and may be formed of an insulating, a conductive, or a semiconductive material such as sapphire, Si, SiC, $MgAl_2O_4$, MgO, $LiAlO_2$, $LiGaO_2$, GaN, or the like. A sapphire substrate is a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the sapphire substrate is commonly used as a nitride growth substrate. However, in the case in which a nitride thin film is grown on the C-plane, a strong electric field may be formed in the nitride thin film due to a piezoelectric effect. Meanwhile, in a case in the substrate 101 is formed of silicon (Si), it may be more appropriate for increasing a diameter and is relatively low in price, facilitating mass-production.

The n-type and p-type semiconductor layers 102 and 104 may be formed of a nitride semiconductor, e.g., a material having a composition of $Al_xIn_yGa_{1-x-y}N$ (0≤x≤1, 0≤y≤1, 0≤x+y≤1). Each of the semiconductor layers 102 and 104 may include a plurality of layers having different characteristics such as different doping concentrations, compositions, and the like. Here, the n-type and p-type semiconductor layers 102 and 104 may be formed of an AlInGaP or AlInGaAs semiconductor, besides a nitride semiconductor. The active layer 103, disposed between the n-type and p-type semiconductor layers 102 and 104, may emit light having a certain level of energy according to the recombination of electrons and holes and may have a multi-quantum well (MQW) structure in which quantum well layers and quantum barrier layers are alternately laminated. For example, in the case of the nitride semiconductor, a GaN/InGaN structure may be used. A single quantum well (SQW) structure may also be used as needed.

Meanwhile, the n-type and p-type semiconductor layers 102 and 104 and the active layer 103 may be grown using a process known in the art, such as metal-organic chemical vapor deposition (MOCVD), hydride vapor phase epitaxy (HVPE), molecular beam epitaxy (MBE), or the like. Also, although not shown, a buffer layer capable of alleviating stress acting on the n-type semiconductor layer 102 to enhance crystallinity may be formed on the substrate 101 in advance before the n-type semiconductor layer 102 is formed.

As shown in region 'A' of FIG. 2, the p-type semiconductor layer 104 may include a plurality of first layers L1-1 to L1-3 and a plurality of second layers L2-1 to L2-3. In the exemplary embodiment of FIG. 2, it is illustrated that three first layers L1-1 to L1-3 and three second layers L2-1 to L2-3 are included in the p-type semiconductor layer, but the number of layers may be greater or smaller. Meanwhile, the plurality of first layers L1-1 to L1-3 and the plurality of second layers L2-1 to L2-3 included in the p-type semiconductor layer 104 may be layers which are physically distinguished or have chemically different compositions. In an exemplary embodiment, the plurality of first layers L1-1 to L1-3 may have different p-type impurity concentrations each other.

In detail, the plurality of first layers L1-1 to L1-3 may be regions doped with a p-type impurity such as magnesium (Mg), zinc (Zn), or the like, purposefully, during a manufacturing process. The plurality of second layers L2-1 to L2-3 may be regions purposefully not doped with a p-type impurity. Also, the p-type impurity concentration included in each of the plurality of first layers L1-1 to L1-3 may be gradually increased in a direction away from the active layer 103 and closer to the p-type contact layer 105. Namely, the first layer L1-1 positioned in the lowermost portion in a lamination direction may have the lowest impurity concentration, while the first layer L1-3 positioned in the uppermost portion may have the highest impurity concentration.

In order to improve electron-hole combination efficiency of the active layer 103 and enhance luminance, the p-type impurity concentration included in the p-type semiconductor layer 104 may be increased. However, if the p-type impurity concentration included in the p-type semiconductor layer 104 is excessively increased, thin film crystallinity of the p-type semiconductor layer 104 may be degraded or the active layer 103 may be damaged during a process of forming the p-type semiconductor layer 104.

In the present disclosure, when forming the p-type semiconductor layer 104, p-type impurity concentrations included in the plurality of first layers L1-1 to L1-3 may be adjusted to be decreased toward the active layer 103 or increased in a direction away from the active layer 103. Thus, the p-type impurity concentration of the entire p-type semiconductor layer 104 may be increased, while minimizing damage that may be done to the active layer 103 and a degradation of thin film crystallinity of the p-type semiconductor layer 104 during the process of forming the p-type semiconductor layer 104. As a result, hole injection efficiency of the p-type semiconductor layer 104 transmitted to the active layer 103 is increased to improve electron-hole combination efficiency in the active layer 103 and increase luminance (light output) of the semiconductor light emitting device 100.

As described above, the plurality of second layers L2-1 to L2-3 are not doped with a p-type impurity injected purposefully, but doped with a p-type impurity diffused during a process of forming the plurality of adjacent first layers L1-1 to L1-3. For example, during a process of manufacturing the semiconductor light emitting device 100, the p-type semiconductor layer 104 may be stacked on the active layer 103 after the n-type semiconductor layer 102 and the active layer 103 are sequentially formed. Thus, the purposefully doped p-type impurity in the first layer L1-2 formed on the second layer L2-1 positioned in the lowermost portion in the lamination direction may be diffused to be introduced to the second layer L2-1. Similarly, the p-type impurity doped in the first layer L1-3 formed on the L2-2 may be diffused to be introduced and doped in the second layer L2-2 positioned in the middle in the lamination direction.

However, since the plurality of second layers L2-1 to L2-3 are purposefully not doped with a p-type impurity, but instead doped with the p-type impurity included in the first layers L1-1 to L1-3 adjacent thereto, which is diffused to be introduced thereto, during the manufacturing process, the plurality of second layers L2-1 to L2-3 may have an impurity concentration lower than those of the first layers L1-1 to L1-3 adjacent thereto. In the exemplary embodiment of FIG. 2, the second layer L2-3 positioned in the uppermost portion in the lamination direction may have an impurity concentration lower than that of the first layer L1-3 adjacent thereto below in the lamination direction.

Similarly, the middle second layer L2-2 may have an impurity concentration lower than that of the first layers L1-2 and L1-3 immediately adjacent thereto in the lamination direction, and the second layer L2-1 positioned in the lowermost portion in the lamination direction may also have an impurity concentration lower than the first layers L1-1 and L1-2 adjacent thereto. Also, since the p-type impurity concentration of each of the first layers L1-1 to L1-3 is increased toward the p-type contact layer 105, the p-type impurity concentration of each of the second layers L2-1 to L2-3 may also be increased toward the p-type contact layer 105. In this case, depending on the amount of the plurality of first layers L1-1 to L1-3 and the plurality of second layers L2-1 to L2-3 included in the p-type semiconductor layer 104, the concentration of the injected p-type impurity, and the like, the p-type impurity concentration of the second layer L2-3 disposed closer to the p-type contact layer 105 may be higher than that of the first layer L1-1 disposed to be away from the p-type contact layer 105.

When forming the p-type semiconductor layer 104, the plurality of first layers L1-1 to L1-3 and the plurality of second layers L2-1 to L2-3 may have different thicknesses. As illustrated in FIG. 2, the thicknesses of the plurality of first layers L1-1 to L1-3 may be gradually increased in the direction away from the interface between the p-type semiconductor layer and the active layer 102 and in the direction toward the p-type contact layer 105. Also, the thicknesses of the plurality of second layers L2-1 to L2-3 may also be gradually increased in the direction toward the p-type contact layer 105, like the plurality of first layers L1-1 to L1-3.

The thicknesses of the plurality of first layers L1-1 to L1-3 gradually increased in the direction toward the p-type contact layer 105 may be related with the impurity concentrations of the plurality of first layers L1-1 to L1-3 gradually increased in the direction toward the p-type contact layer 105. Namely, in a case in which a p-type impurity such as magnesium (Mg) or zinc (Zn) is purposefully injected into the plurality of first layers L1-1 to L1-3, if only a doping concentration of the p-type impurity is increased without adjusting the thicknesses of the plurality of first layers L1-1 to L1-3, thin film crystallinity of the plurality of first layers L1-1 to L1-3 may be degraded.

In the present exemplary embodiment, the thicknesses and impurity concentrations of the plurality of first layers L1-1 to L1-3 may be increased together in a direction away from the active layer 103 in the lamination direction. In the present exemplary embodiment, the thicknesses of the plurality of first layers L1-1 to L1-3 may be respectively increased in proportion to impurity concentrations. By forming the plurality of first layers L1-1 to L1-3 having thicknesses increased in proportion to the increase in the impurity concentrations, a degradation of thin film crystallinity of the plurality of first layers L1-1 to L1-3 may be prevented.

In the present exemplary embodiment, since the plurality of first layers L1-1 to L1-3 purposefully doped with a p-type impurity and the plurality of second layers L2-1 to L2-3 purposefully non-doped are alternately stacked to be disposed, a concentration of holes may be increased and holes may be effectively distributed in the p-type semiconductor layer 104. It is generally known that, in the case of doping with magnesium (Mg) in the p-type semiconductor layer 102, magnesium (Mg) reacts with hydrogen, a carrier gas, to form an Mg—H compound during an metal-organic chemical vapor deposition (MOCVD) process, making it difficult for magnesium (Mg) to be ionized, and thus, it is difficult to increase a hole concentration to a level higher than a predetermined level. However, in the present exemplary embodiment, since the plurality of first layers L1-1 to L1-3 having different p-type impurity concentrations and the plurality of second layers L2-1 to L2-3 are alternately disposed, an acceptor energy level may be lowered, increasing a hole concentration, and thus, enhancing mobility of holes.

Meanwhile, the other components will be described with reference to FIG. 1. The p-type contact layer 105 may be formed of a material having ohmic characteristics with respect to the p-type semiconductor layer 104. For example, the p-type contact layer 105 may include p-GaN including a p-type impurity having a high concentration, relative to the p-type semiconductor layer 104. Alternatively, the p-type contact layer 105 may be formed of a metal such as Ag, Ni, Al, Rh, Pd, Ir, Ru, Mg, Zn, Pt, Au, or the like, or may be formed of a transparent conductive oxide such as ITO, CIO, ZnO, or the like. However, the p-type contact layer 105 may not be an essential element in the present exemplary embodiment and may be omitted according to circumstances.

The first and second electrodes 106a and 106b may be formed through a process such as depositing an electroconductive material known in the art, for example, one or more of materials such as Ag, Al, Ni, Cr, and the like. However, in the case of the structure illustrated in FIG. 1, the first and second electrodes 106a and 106b are respectively formed on upper surfaces of the n-type semiconductor layer 102 and the p-type contact layer 105, but such a scheme of forming the electrodes 106a and 106b is merely an example.

Figure 3:
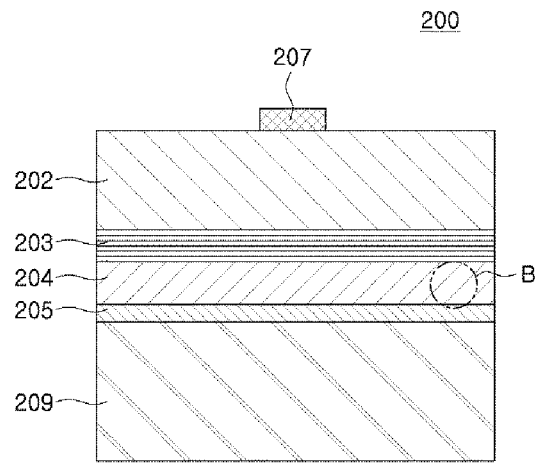
FIG. 3 is a cross-sectional view schematically illustrating a semiconductor light emitting device according to an exemplary embodiment of the present disclosure.

FIG. 3 is a cross-sectional view schematically illustrating a semiconductor light emitting device according to an exemplary embodiment of the present disclosure.

Figure 4:
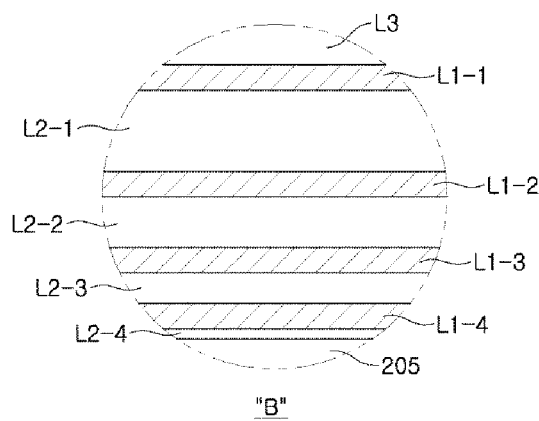
FIG. 4 is an enlarged view of a p-type semiconductor layer employable in the semiconductor light emitting device of FIG. 3.

FIG. 4 is an enlarged view of a p-type semiconductor layer employable in the semiconductor light emitting device of FIG. 3. Specifically, FIG. 4 is an enlarged view of a region 'B' of FIG. 3.

Referring to FIG. 3, a semiconductor light emitting device according to the present exemplary embodiment includes a light emitting structure formed on a conductive substrate 209, and the light emitting structure includes an n-type semiconductor layer 202, an active layer 203, and a p-type semiconductor layer 204. Also, an n-type electrode 207 is formed on the n-type semiconductor layer 202, and a reflective metal layer 205 and the conductive substrate 209 may be formed below the p-type semiconductor layer 204.

In the present exemplary embodiment, the p-type semiconductor layer 204 may include a plurality of first layers L1-1 to L1-4, a plurality of second layers L2-1 to L2-4, and a third layer L3 disposed at an interface between the p-type semiconductor layer 204 and the active layer 203. The plurality of first layers L1-1 to L1-4 may be purposefully doped with a p-type impurity such as magnesium (Mg), zinc (Zn), or the like, and the plurality of second layers L2-1 to L2-4 may not include a purposefully injected p-type impurity. The plurality of first layers L1-1 to L1-4 and the plurality of second layers L2-1 to L2-4 may be a plurality of layers that may be formed by adjusting a period of injection time of the p-type impurity during a manufacturing process.

Each of the plurality of second layers L2-1 to L2-4 does not include a p-type impurity injected purposefully, during the manufacturing process, but may include a p-impurity diffused from the plurality of first layers L1-1 to L1-4 adjacent thereto. However, since the p-type impurity included in the second layers L2-1 to L2-4 are impurity introduced upon being diffused from the plurality of first layers L1-1 to L1-4 adjacent thereto, a concentration of the p-type impurity included in each of the plurality of second layers L2-1 to L2-4 may be less than that of the p-type impurity included in each of the first layers L1-1 to L1-4 adjacent thereto.

The concentration of the p-type impurity of each of the plurality of first layers L1-1 to L1-4 may be increased in a direction away from the active layer 203 and in a direction closer to the reflective metal layer 205. A concentration or the p-type impurity of the first layer L1-1 closest to the active layer 203 may be less than those of other first layers L1-2 to L1-4 to prevent a degradation of quality of the active layer 203 caused by an introduction of the p-type impurity included in the first layer L1-1 to the active layer 203.

By increasing the concentration of the p-type impurity of each of the plurality of first layers L1-1 to L1-4 in a direction away from the active layer 203, the concentration of the p-type impurity of the entirety of the p-type semiconductor layer 204 may be increased, and a degradation of thin film crystallinity of the p-type semiconductor layer 204 may be prevented. As the concentration of the p-type impurity is increased, an acceptor energy level may be reduced, increasing hole injection efficiency, and thus, improving luminance of the semiconductor light emitting device 200.

The p-type semiconductor layer 204 may include the third layer L3 disposed in the interface between the p-type semiconductor layer 204 and the active layer 203. The third layer L3 may be a low-growth p-GaN layer or may be a p-GaN layer doped with a low concentration. The third layer L3 may be selectively disposed in the interface between the p-type semiconductor layer 204 and the active layer 203, and, in particular, the third layer L3 may be applied to the vertical semiconductor light emitting device 200 as illustrated in FIG. 3. A thickness of the third layer L3 may be determined by controlling optical cavity characteristics of the vertical semiconductor light emitting device 200. For example, the thickness of the third layer L3 may be determined according to a thickness from a quantum barrier layer included in the active layer 203 and disposed to be closest to the interface with the third layer L3 to the reflective metal layer 205.

Meanwhile, in the exemplary embodiment illustrated in FIG. 4, thicknesses of the plurality of first layers L1-1 to L1-4 may be substantially identical. The wording "the plurality of first layers L1-1 to L1-4 are substantially identical" may be understood as a meaning that thickness variations of each of the plurality of first layers L1-1 to L1-4 are minimized by controlling a p-type impurity injection time to be equal purposefully, during a manufacturing process.

Thicknesses of the plurality of second layers L2-1 to L2-4 may be reduced in a direction away from the active layer 203. Namely, as in the exemplary embodiment illustrated in FIG. 4, the thickness of the second layer L2-1 closest to the active layer 203 is the greatest, while the thickness of the second layer L2-4 closest to the reflective metal layer 205 may be the smallest. The thicknesses of the second layers L2-1 and L2-2 may be relatively increased to prevent the p-type impurity included in the plurality of first layers L1-2 and L1-3 from being diffused to the active layer 203

The second layers L2-1 and L2-2 close to the active layer 203 may be formed to have a thickness sufficient to prevent the p-type impurity included in the first layer L1-2 adjacent thereto from being diffused to be introduced to the active layer 203. Meanwhile, the second layers L2-3 and L2-4 disposed to be close to the p-type contact layer, relative to the active layer 203, may be formed to be thinner than the other second layers L2-1 and L2-2. Thus, the thicknesses of the plurality of second layers L2-1 to L2-4 may be reduced in the direction away from the active layer 203 and in the direction closer to the reflective metal layer 205.

The reflective metal layer 205 is formed of a material having electrically ohmic-characteristics with respect to the p-type semiconductor layer 204. Namely, the reflective metal layer 205 may be formed of a metal having high reflectivity to reflect light emitted from the active layer 203. In consideration of this function, the reflective metal layer 205 may be formed of a material such as Ag, Ni, Al, Rh, Pd, Ir, Ru, Mg, Zn, Pt, Au, or the like.

The conductive substrate 209 may be connected to an external power source to apply an electrical signal to the p-type semiconductor layer 204. Also, the conductive substrate 209 may serve as a support supporting the light emitting structure during a process such as a laser-lift off (LLO) process, or the like, for removing the substrate used to grow a semiconductor and may be formed of a material including any one of Au, Ni, Al, Cu, W, Si, Se, and GaAs, for example, a material doped with aluminum (Al) in a silicon substrate. In this case, the conductive substrate 209 may be formed on the reflective metal layer 205 through a process such as plating, sputtering, or the like, and alternatively, a previously manufactured conductive substrate 209 may be bonded to the reflective metal layer 205 by the medium of a conductive bonding layer, or the like.

Figure 5:
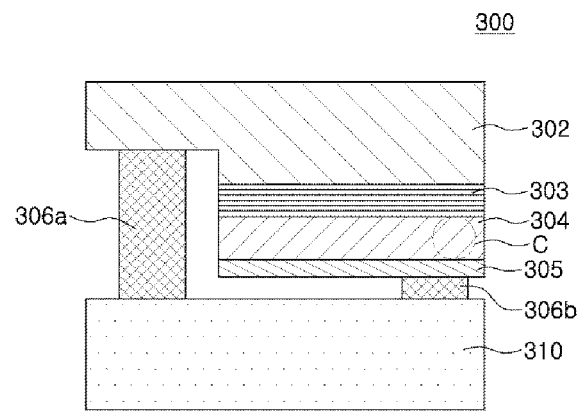
FIG. 5 is a cross-sectional view schematically illustrating a semiconductor light emitting device according to an exemplary embodiment of the present disclosure.

FIG. 5 is a cross-sectional view schematically illustrating a semiconductor light emitting device according to an exemplary embodiment of the present disclosure.

Figure 6:
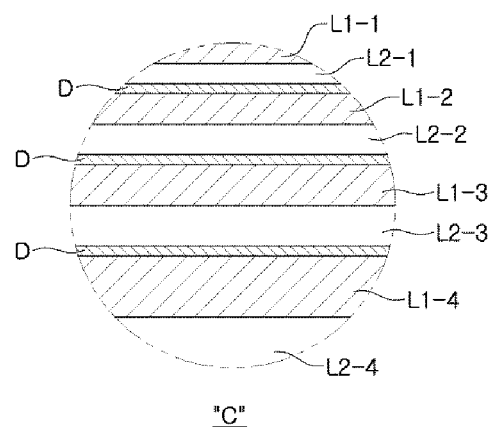
FIG. 6 is an enlarged view of a p-type semiconductor layer employable in the semiconductor light emitting device of FIG. 5.

FIG. 6 is an enlarged view of a p-type semiconductor layer employable in the semiconductor light emitting device of FIG. 5. Specifically, FIG. 5 is an enlarged view of a region 'C' of FIG. 5.

Referring to FIG. 5, a semiconductor light emitting device 300 according to the present exemplary embodiment includes a light emitting structure formed on a package substrate 310. The light emitting structure may include an n-type semiconductor layer 302, an active layer 303, and a p-type semiconductor layer 304. First and second electrodes 306a and 306b may be formed on lower surfaces of the n-type semiconductor layer 302 and a p-type contact layer 305. The semiconductor light emitting device 300 according to the present exemplary embodiment may have a so-called flipchip structure in which the first and second electrodes 306a and 306b are mounted on the package substrate 310.

In the present exemplary embodiment, the p-type semiconductor layer 304 may include a plurality of first layers L1-1 to L1-4 doped with a purposefully injected p-type impurity and a plurality of second layers L2-1 to L2-4 disposed between the plurality of first layers L1-1 to L1-4. Also, referring to FIG. 6, in the p-type semiconductor layer 304 included in the semiconductor light emitting device 300 according to the present exemplary embodiment, n-type impurity-doped regions D to which an n-type impurity is injected may be formed. The n-type impurity-doped regions D may be disposed in at least one of interfaces between the plurality of first layers L1-1 to L1-4 and the plurality of second layers L2-1 to L2-4 adjacent thereto.

Referring to FIG. 6, the n-type impurity-doped regions D may be formed in interfaces between the first layers L1-2 to L1-4 adjacent to the ohmic-electrode layer 305 and the second layers L2-1 to L2-3 among the plurality of second layers L2-1 to L2-4. The n-type impurity-doped regions D may be thinner than the plurality of first layers L1-1 to L1-4 and the plurality of second layers L2-1 to L2-4.

By forming the n-type impurity-doped regions D in the second layers L2-1 to L2-3 adjacent to the first layers L1-2 to L1-4, a p-type impurity which is diffused to be introduced from the first layers L1-2 to L1-4 to the second layers L2-1 to L2-3 may be blocked. In order to form the n-type impurity-doped regions D, an n-type impurity may be injected purposefully during a time duration in which the p-type impurity is purposefully not injected, during a manufacturing process, and this will be described in detail with reference to FIG. 7C hereinafter. Meanwhile, thicknesses of the n-type impurity-doped regions D included in the respective second layers L2-1 to L2-3 may be substantially equal.

The p-type contact layer 305 may be formed of a light-reflective material, for example, a highly reflective metal. The p-type contact layer 305 may include a material such as Ag, Ni, Al, Rh, Pd, Ir, Ru, Mg, Zn, Pt, Au, and the like.

The light emitting structure is mounted on one surface of the package substrate 310, and a circuit board such as a printed circuit board (PCB), a metal-core printed circuit board (MCPCB), a metal printed circuit board (MPCB), a flexible printed circuit board (FPCB, a ceramic board such as AlN, $Al_2O_3$, or the like, or a silicon substrate may be provided as the package board 310. Also, the package substrate 310 may be provided as a lead frame of a package, rather than as a board.

Meanwhile, the structure of the p-type semiconductor layer 304 may also be applied to the semiconductor light emitting device 100 of FIG. 1 and the p-type semiconductor layers 104 and 204 of the semiconductor light emitting device 200 of FIG. 3. Similarly, the structure of the p-type semiconductor layer 104 illustrated in FIG. 2 may also be applied to the semiconductor light emitting devices 200 and 300 illustrated in FIGS. 3 and 5, and the p-type semiconductor layer 204 may also be applied to the semiconductor light emitting devices 100 and 300 illustrated in FIGS. 1 and 5.

Figure 7A:
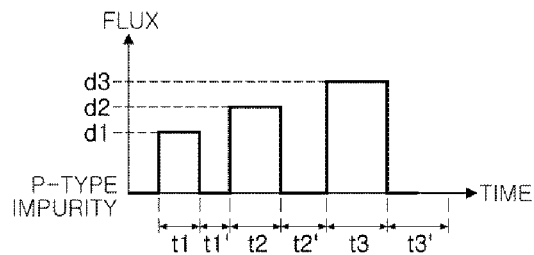
FIGS. 7A through 7C are impurity injection flow diagrams illustrating a method for forming a p-type semiconductor layer of a semiconductor light emitting device according to an exemplary embodiment of the present disclosure.
Figure 7B:
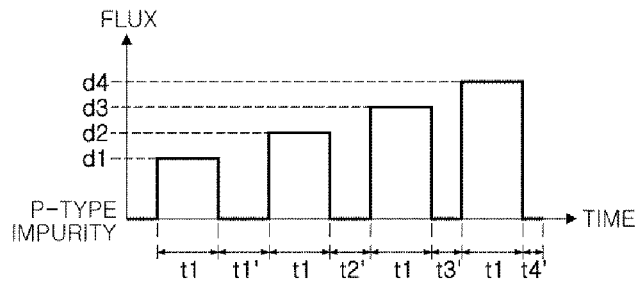
Figure 7C:
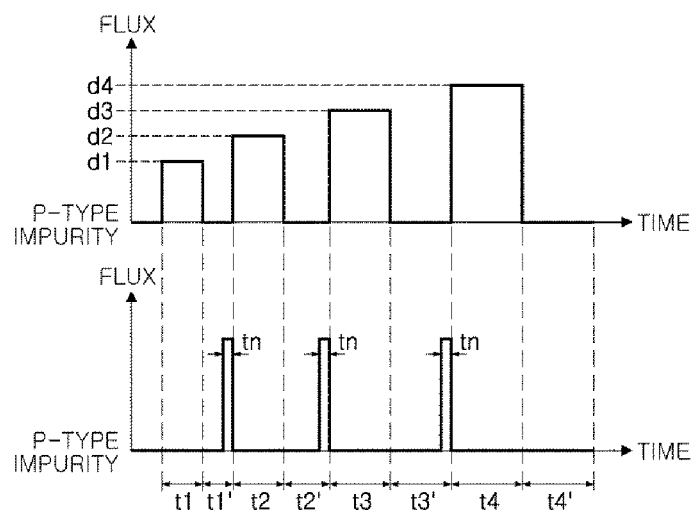

FIGS. 7A through 7C are impurity injection flow diagrams illustrating a method for forming a p-type semiconductor layer of a semiconductor light emitting device according to an exemplary embodiment of the present disclosure.

In FIGS. 7A through 7C, the vertical axes represent amounts of a p-type impurity and an n-type impurity or carrier gases including these impurities injected during a process of forming a p-type semiconductor layer, and horizontal axes represent an injection time duration. In FIGS. 7A through 7C, scales of the horizontal axes and vertical axes may only represent relative sizes, rather than being particularly limited. Also, in FIGS. 7A through 7C, the p-type impurity, the n-type impurity, or the carrier gas including the impurities may be supplied by a gas such as trimethylgallium, ammonia, or the like, while a p-type semiconductor layer is formed.

Referring to FIG. 7A, a flow diagram of impurity injection to the p-type semiconductor layer 104 as described above with reference to FIG. 2 is illustrated. A p-type impurity is injected during first time durations t1 to t3, and injection of the p-type impurity is suspended during second time durations t1' to t3' between the first time durations t1 to t3. The p-type impurity may be injected during a first time duration t1 to form the first layer L1-1 closest to the active layer 103. When the first time duration t1 has lapsed, the injection of the p-type impurity is suspended during the second time duration t1' and the second layer L2-1 closest to the active layer 103 may be formed.

In this manner, injection of the p-type impurity and suspension of the injection may be repeated to form the plurality of first layers L1-1 to L1-3 and the plurality of second layers L2-1 to L2-3 alternately disposed in the lamination direction. In the exemplary embodiment of FIG. 7A, the first time durations t1 to t3 during which the p-type impurity is injected and the second time durations t1' to t3' during which the injection of the p-type impurity is suspended may be gradually increased by lapse of time. Namely, the first time duration t2 is greater than the first time duration t1, and the first time duration t3 may be greater than the first time duration t2.

As a result, thicknesses of the plurality of first layers L1-1 to L1-3 to which the p-type impurity is purposefully injected and the plurality of second layers L2-1 to L2-3 to which the p-type impurity is purposefully not injected may be gradually increased in a direction away from the active layer 103. Accordingly, the p-type semiconductor layer 104 according to the exemplary embodiment illustrated in FIG. 2 may be formed. However, each of the plurality of second layers L2-1 to L2-3 are not doped with the purposefully injected p-type impurity injected, but may include a p-type impurity which is introduced upon being diffused from the first layers L1-1 to L1-3 adjacent thereto.

Also, with the passage of time, the injection amounts of the p-type impurity introduced during the first time durations t1 to t3 may be gradually increased. As illustrated in FIG. 7A, the injection amounts d1 to d3 of the p-type impurity injected during the respective first time durations t1 to t3 may have relationships of d1<d2<d3. Thus, concentrations of the p-type impurity in each of the plurality of first layers L1-1 to L1-3 may be increased in a direction away from the active layer 103.

Referring to FIG. 7B, a flow diagram of impurity injection in the p-type semiconductor layer 204 as described above with reference to FIG. 4 is illustrated. Compared to the case of FIG. 7A, injection of a p-type impurity and suspension thereof are repeated in the same manner, but the first time durations t1 during which the p-type impurity is injected are uniform regardless of the passage of time, while the second time durations t1' to t4' between the first time durations t1 during which the p-type impurity is injected are gradually decreased by lapse of time.

Thus, in the case of the p-type semiconductor layer 204 formed by the impurity injection flow illustrated in FIG. 7B, thicknesses of the plurality of first layers L1-1 to L1-4 to which the p-type impurity is purposefully injected may be substantially equal. Also, thicknesses of the plurality of second layers L2-1 to L2-4 to which a p-type impurity is purposefully not injected may be gradually decreased in a direction away from the active layer 203.

Meanwhile, concentrations of the p-type impurity injected during the first time durations t1 may be gradually increased with the passage of time, similar to the exemplary embodiment of FIG. 7A. Namely, the concentrations of the p-type impurity injected during the first time durations t1 may have relationships of d1<d2<d3<d4 and the concentration of the p-type impurity of each of the plurality of first layers L1-1 to L1-4 may be increased in a direction away from the active layer 103.

Referring to FIG. 7C, a flow diagram of impurity injection in the p-type semiconductor layer 304 as described above with reference to FIG. 6 is illustrated. Compared to the case of FIGS. 7A and 7B, the plurality of first layers L1-1 to L1-4 may be formed by injecting a p-type impurity purposefully, during the first time durations t1 to t4 and the injection of the p-type impurity may be suspended during the second time durations t1' to t4' between the first time durations t1 to t4 and the plurality of second layers L2-1 to L2-4 may be formed.

In this case, the first time durations t1 to t4 and the second time durations t1' to t4' may be gradually increased with the passage of time, and thus, as illustrated in FIG. 6, thicknesses of the plurality of first layers L1-1 to L1-4 and the plurality of second layers L2-1 to L2-4 may be increased in a direction away from the active layer 303. Also, the concentrations d1 to d4 of the p-type impurity injected during the first time durations t1 to t4 may be gradually increased by lapse of time, and as a result, the concentration of the p-type impurity included in each of the plurality of first layers L1-1 to L1-4 may be increased in a direction away from the active layer 303.

Meanwhile, in the exemplary embodiment of FIG. 7C, an n-type impurity may be injected during portions of the second time durations t1' to t3'. Namely, based on the horizontal axis representing the passage of time, the n-type impurity may be injected during time durations to of the partial second time durations t1' to t3'. Thus, the n-type impurity-doped regions D1 including the n-type impurity may be formed in the interfaces between the partial second layers L2-1 to L2-3 and the first layers L1-2 to L1-4. The n-type impurity-doped regions D may block the p-type impurity diffused to be introduced from the adjacent first layers L1-2 to L1-4 to the second layers L2-1 to L2-3 including the n-type impurity-doped regions D. The time durations to during which the n-type impurity is injected to form the n-type impurity-doped regions D may be equal.

Figure 8:
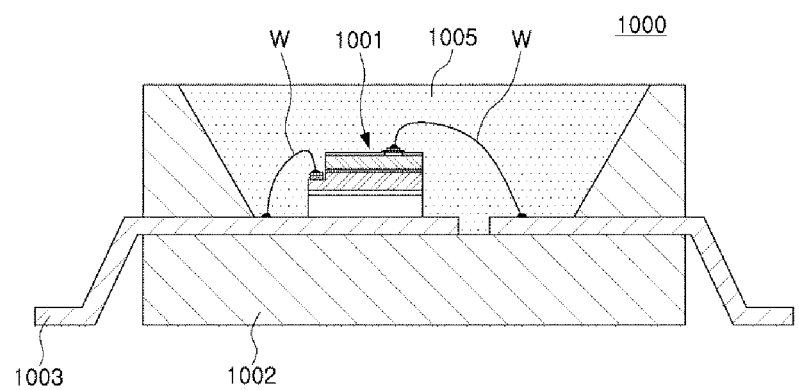
FIGS. 8 and 9 are views illustrating an example of application of a semiconductor light emitting device according to an exemplary embodiment of the present disclosure to a package.
Figure 9:
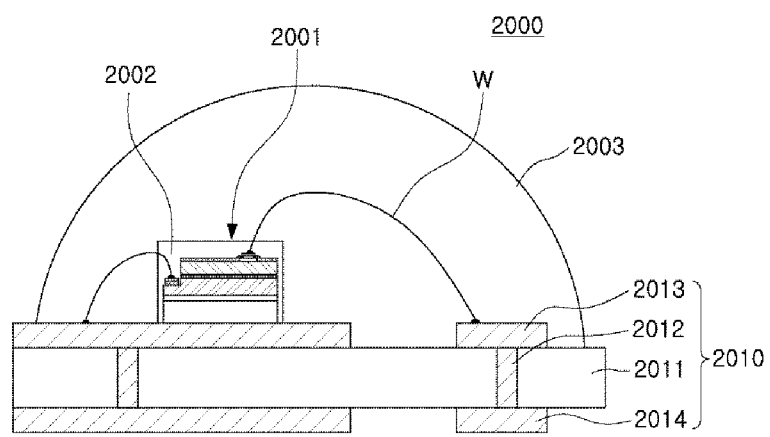

FIGS. 8 and 9 are views illustrating an example of application of a semiconductor light emitting device according to an exemplary embodiment of the present disclosure to a package.

Referring to FIG. 8, a semiconductor light emitting device package 1000 may include a semiconductor light emitting device 1001, a package body 1002, and a pair of lead frames 1003. The semiconductor light emitting device 1001 may be mounted on the lead frame 1003 and electrically connected to the lead frame 1003 through a wire W. According to an exemplary embodiment, the semiconductor light emitting device 1001 may be mounted on a different region, for example, on the package body 1002, rather than on the lead frame 1003. The package body 1002 may have a cup shape to improve reflective efficiency of light. An encapsulant 1005 formed of a light-transmissive material may be formed in the reflective cup to encapsulate the semiconductor light emitting device 1001, the wire W, and the like. In the present exemplary embodiment, the semiconductor light emitting device package 1000 is illustrated as including the semiconductor light emitting device 100 illustrated in FIG. 1 but it may also include the semiconductor light emitting devices 200 and 300 illustrated in FIGS. 3 and 5.

Referring to FIG. 9, a semiconductor light emitting device package 2000 may include a semiconductor light emitting device 2001, a mounting board 2010, and an encapsulant 2003. Also, a wavelength conversion unit 2002 may be formed on an upper surface and lateral surfaces of the semiconductor light emitting device 2001. The semiconductor light emitting device 2001 may be mounted on the mounting board 2010 and electrically connected to the mounting board 2010 through a wire W and the conductive substrate 209 (please refer to FIG. 3).

The mounting board 2010 may include a board body 2011, an upper electrode 2013, and a lower electrode 2014. Also, the mounting board 2010 may include a through electrode 2012 connecting the upper electrode 2013 and the lower electrode 2014. The mounting board 2010 may be provided as a board such as PCB, MCPCB, MPCB, FPCB, or the like, and the structure of the mounting board 2010 may be applied to have various forms.

The wavelength conversion unit 2002 may include a phosphor, a quantum do, and the like. The encapsulant 2003 may be formed to have a lens structure with an upper surface having a convex dome shape. However, according to an exemplary embodiment, the encapsulant 2003 may have a lens structure having a convex or concave surface to adjust a beam angle of light emitted through an upper surface of the encapsulant 2003.

In the present exemplary embodiment, the semiconductor light emitting device package 2000 is illustrated as including the semiconductor light emitting device 200 illustrated in FIG. 3, but it may also include the semiconductor light emitting devices 100 and 300 of FIGS. 1 and 5 according to an exemplary embodiment.

Figure 10:
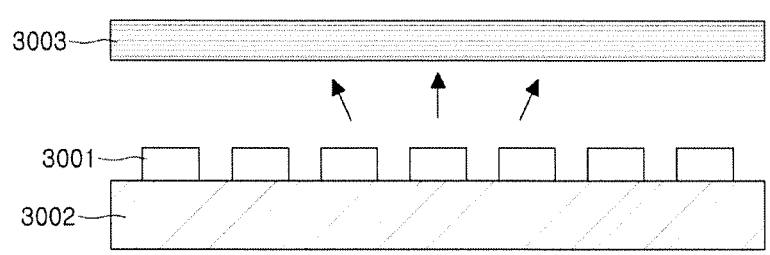
FIGS. 10 and 11 are views illustrating an example of application of a semiconductor light emitting device according to an exemplary embodiment of the present disclosure to a backlight unit.
Figure 11:
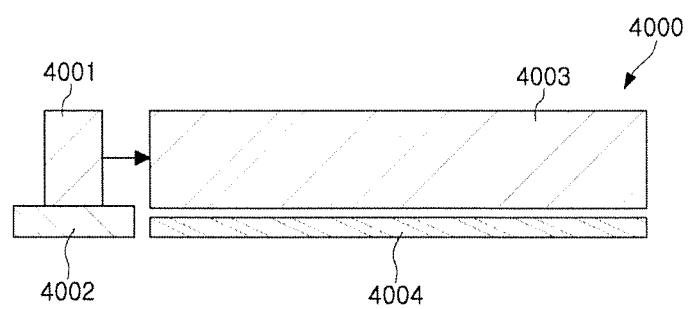

FIGS. 10 and 11 are views illustrating an example of application of a semiconductor light emitting device according to an exemplary embodiment of the present disclosure to a backlight unit.

Referring to FIG. 10, a backlight unit 3000 includes light sources 3001 mounted on a substrate 3002 and one or more optical sheets 3003 disposed above the light sources 3001. The semiconductor light emitting device package having the structure described above with reference to FIGS. 8 and 9 or a structure similar thereto may be used as the light sources 3001. Alternatively, a semiconductor light emitting device may be directly mounted on the substrate 3002 (a so-called COB type) and used.

Unlike the backlight unit 3000 in FIG. 10 in which the light sources 3001 emit light toward an upper side where a liquid crystal display is disposed, a backlight unit 4000 as another example illustrated in FIG. 11 is configured such that a light source 4001 mounted on a substrate 4002 emits light in a lateral direction, and the emitted light may be made to be incident to a light guide plate 4003 so as to be converted into a surface light source. Light, passing through the light guide plate 4003, is emitted upwards, and in order to enhance light extraction efficiency, a reflective layer 4004 may be disposed on a lower surface of the light guide plate 4003.

Figure 12:
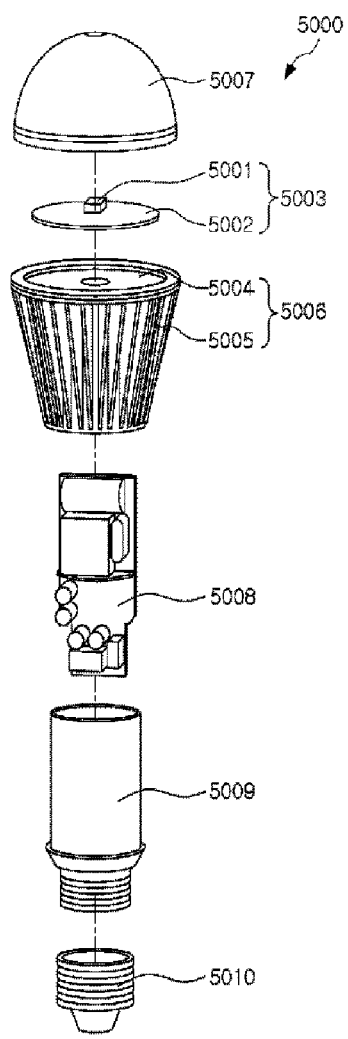
FIG. 12 is a view illustrating an example of application of a semiconductor light emitting device according to an exemplary embodiment of the present disclosure to a lighting device.

FIG. 12 is a view illustrating an example of application of a semiconductor light emitting device according to an exemplary embodiment of the present disclosure to a lighting device.

Referring to the exploded perspective view of FIG. 14, a lighting device 5000 is illustrated as, for example, a bulb-type lamp and includes a light emitting module 5003, a driving unit 5008, and an external connection unit 5010. Also, the lighting device 5000 may further include external structures such as external and internal housings 5006 and 5009 and a cover unit 5007. The light emitting module 5003 may include any one 5001 of semiconductor light emitting devices illustrated in FIGS. 1, 3, 5, 8, and 9, and a circuit board 5002 having the semiconductor light emitting device 5001 mounted thereon. In the present exemplary embodiment, it is illustrated that a single semiconductor light emitting device 5001 is mounted on the circuit board 5002, but a plurality of semiconductor light emitting devices may be installed as needed. Also, the semiconductor light emitting device 5001 may be manufactured as a package and subsequently mounted, rather than being directly mounted on the circuit board 5002.

In the lighting device 5000, the light emitting module 5003 may include the external housing 5006 serving as a heat dissipation unit and the external housing 5006 may include a heat dissipation body 5005 and a heat dissipation plate 5004 disposed to be in direct contact with the light emitting module 5003 to enhance heat dissipation. Also, the lighting device 5000 may include the cover unit 5007 installed on the light emitting module 5003 and having a convex lens shape. The driving unit 5008 may be installed in the internal housing 5009 and connected to the external connection unit 5010 having a socket structure to receive power from an external power source. Also, the driving unit 5008 may serve to convert power into an appropriate current source for driving the semiconductor light emitting device 5001 of the light emitting module 5003, and provide the same. For example, the driving unit 5008 may be configured as an AC-DC converter, a rectifying circuit component, or the like.

Figure 13:
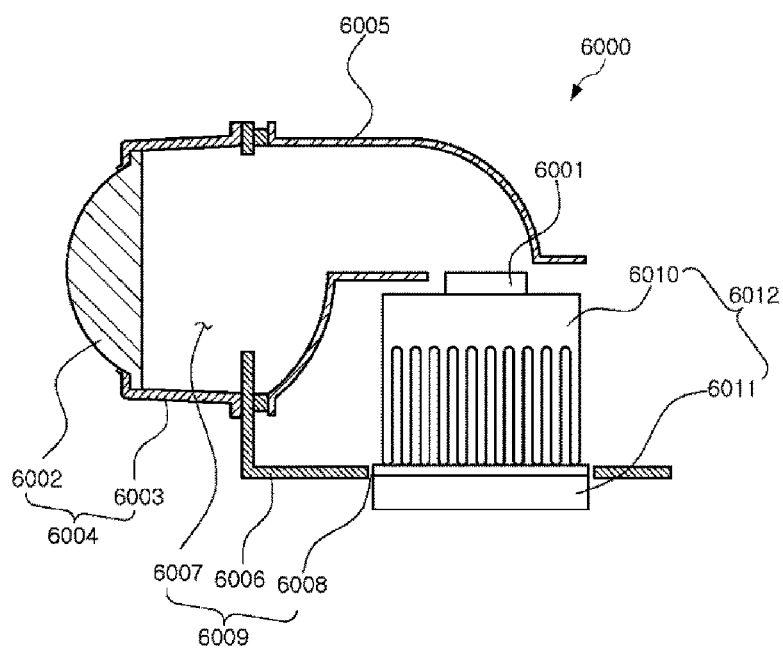
FIG. 13 is a view illustrating an example of application of a semiconductor light emitting device according to an exemplary embodiment of the present disclosure to a headlamp.

FIG. 13 is a view illustrating an example of application of a semiconductor light emitting device according to an exemplary embodiment of the present disclosure to a headlamp.

Referring to FIG. 13, a headlamp 6000 used as a vehicle lamp, or the like, may include a light source 6001, a reflective unit 6005, and a lens cover unit 6004. The lens cover unit 6004 may include a hollow guide 6003 and a lens 6002. The headlamp 6000 may further include a heat dissipation unit 6012 outwardly dissipating heat generated by the light source 6001. In order to effectively dissipate heat, the heat dissipation unit 6012 may include a heat sink 6010 and a cooling fan 6011. Also, the headlamp 6000 may further include a housing 6009 having a member 6006 fixedly supporting the heat dissipation unit 6012 and the reflective unit 6005, and the member 6006 of the housing 6009 may have a central hole 6008 formed in one surface thereof, in which the heat dissipation unit 6012 is coupled. Also, the member 6006 of the housing 6009 may have a front hole 6007 formed in the other surface integrally connected to the one surface and bent at a right angle to allow the reflective unit 6005 to be fixedly positioned above the light source 6001. Accordingly, the front side is opened by the reflective unit 6005, and the reflective unit 6005 is fixed to the member 6006 of the housing 6009 such that the open front side corresponds to the front hole 6007 and light generated by the light source 6001 is reflected thereby to pass through the front hole 6007 to be output outwardly.

As set forth above, the semiconductor light emitting device according to exemplary embodiments of the present disclosure having high luminance by improving hole injection efficiency to increase electron-hole combination efficiency may be provided.

Advantages and effects of the present disclosure are not limited to the foregoing content and any other technical effects not mentioned herein may be easily understood by a person skilled in the art from the foregoing description.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A semiconductor light emitting device comprising:
   an n-type semiconductor layer;
   a p-type semiconductor layer including a plurality of first and second layers, each containing a p-type impurity, the plurality of first and second layers are alternately stacked, and impurity concentrations of the plurality of first layers increase in a direction away from the n-type semiconductor layer; and
   an active layer disposed between the n-type semiconductor layer and the p-type semiconductor layer,
   wherein thicknesses of the plurality of first layers having increasing impurity concentrations increase in relation with the increase in impurity concentrations in the direction away from the n-type semiconductor layer.

2. The semiconductor light emitting device of claim 1, wherein each of the plurality of second layers has an impurity concentration lower than that of the first layers immediately adjacent thereto.

3. The semiconductor light emitting device of claim 1, wherein:
   thicknesses of each of the plurality of second layers are gradually decreased in a direction away from the active layer, and
   a maximum difference in thickness of the plurality of second layers is greater than a maximum difference in thickness of the plurality of first layers.

4. The semiconductor light emitting device of claim 1, wherein respective thicknesses of the plurality of first layers are gradually increased in proportion to impurity concentrations in the direction away from the active layer.

5. The semiconductor light emitting device of claim 1, wherein respective thicknesses of the plurality of second layers are gradually increased in the direction away from the active layer.

6. The semiconductor light emitting device of claim 5, wherein respective thicknesses of the plurality of first layers are equal to or greater than those of the second layers adjacent thereto.

7. The semiconductor light emitting device of claim 1, further comprising:
   a p-type contact layer disposed on the p-type semiconductor layer,
   wherein the p-type contact layer is disposed to be in contact with any one of the plurality of second layers.

8. The semiconductor light emitting device of claim 1, wherein the active layer is disposed to be in contact with any one of the plurality of first layers included in the p-type semiconductor layer.

9. The semiconductor light emitting device of claim 1, wherein an n-type impurity is doped in at least one of a plurality of interfaces between the plurality of first layers and the plurality of second layers.

10. The semiconductor light emitting device of claim 1, wherein each of the plurality of second layers is doped with the p-type impurity diffused from the first layers.

11. The semiconductor light emitting device of claim 1, wherein the p-type semiconductor layer includes a third layer disposed at an interface between the p-type semiconductor layer and the active layer.

12. The semiconductor light emitting device of claim 11, wherein a thickness of the third layer is determined according to a thickness of the p-type semiconductor layer.

13. A light emitting device package comprising:
   a mounting board;
   the semiconductor light emitting device of claim 1 disposed on the mounting board;
   a wavelength conversion unit disposed at least on an upper surface of the semiconductor light emitting device; and
   an encapsulant surrounding the semiconductor light emitting device.

14. A light emitting device package comprising:
   a package body;
   the semiconductor light emitting device of claim 1 disposed on the package body; and
   an encapsulant surrounding the semiconductor light emitting device.

15. A semiconductor light emitting device comprising:
   an n-type semiconductor layer;
   an active layer disposed on the n-type semiconductor layer; and
   a p-type semiconductor layer disposed on the active layer and including pluralities of first and second layers which are alternately stacked, wherein:
      the plurality of first layers and the plurality of second layers include a p-type impurity,
      an impurity concentration of each of the plurality of first layers is higher than the impurity concentrations of the second layers adjacent thereto, and
      thicknesses of the plurality of first layers having the impurity concentrations higher than adjacent second layers increase in a direction away from the n-type semiconductor layer,
   wherein an impurity concentration of each of the plurality of first layers is higher than or equal to that of other first layers disposed closer to the active layer, and
   wherein thicknesses of each of the plurality of first layers are proportional to impurity concentrations of each of the plurality of first layers.

* * * * *